(12) United States Patent  (10) Patent No.: US 7,573,735 B2
Takase et al.  (45) Date of Patent: Aug. 11, 2009

(54) SYSTEMS AND METHODS FOR IMPROVING MEMORY RELIABILITY

(75) Inventors: Satoru Takase, Austin, TX (US); Takehito Sasaki, Austin, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 325 days.

(21) Appl. No.: 11/530,271

(22) Filed: Sep. 8, 2006

(65) Prior Publication Data

US 2008/0062747 A1 Mar. 13, 2008

(51) Int. Cl.
*G11C 11/00* (2006.01)
(52) U.S. Cl. .............. 365/154; 365/189.06; 365/189.2; 365/196; 365/210.12
(58) Field of Classification Search .......... 365/154, 365/189.2, 189.08, 196, 210.12, 189.06
See application file for complete search history.

(56) References Cited

U.S. PATENT DOCUMENTS 5,091,879 A * 2/1992 Tran ........................... 365/177
6,101,126 A * 8/2000 Chung et al. ............ 365/185.23
6,144,606 A * 11/2000 Pan ............................. 365/226

OTHER PUBLICATIONS

U.S. Appl. No. 11/558,045, Takase.

* cited by examiner

*Primary Examiner*—Pho M. Luu
(74) *Attorney, Agent, or Firm*—Law Offices of Mark L. Berrier

(57) ABSTRACT

Systems and methods for reducing instability and writability problems arising from relative variations between voltages at which memory cells and logic components that access the memory cells operate by inhibiting memory accesses when the voltages are not within an acceptable operating range. One embodiment comprises a pipelined processor having logic components which receive power at a first voltage and a set of SRAM cells which receive power at a second voltage. A critical condition detector is configured to monitor the first and second voltages and to determine whether the ratio of these voltages is within an acceptable range. When the voltages are not within the acceptable range, an exception is generated, and an exception handler stalls the processor pipeline to inhibit accesses to the SRAM cells. When the voltages return to the acceptable range, the exception handler resumes the pipeline and completes handling of the exception.

18 Claims, 12 Drawing Sheets

SYSTEMS AND METHODS FOR IMPROVING MEMORY RELIABILITY

BACKGROUND

1. Field of the Invention

The invention relates generally to memory systems, and more particularly to systems and methods for reducing instability and writability problems that arise from relative variations of voltages provided to logic components and memory cells.

2. Related Art

The demand for improved electronic and computing devices continually drives the development of smaller, faster and increasingly efficient devices. As transistors for these devices are scaled down, they may adopt lower operating voltages to allow them to dissipate less power. While this generally does not present problems for much of the logic in a computing device, it may cause problems with the stability and writability of SRAM cells that are used in conjunction with the logic.

One of the ways these SRAM stability and writability problems is typically addressed is by using an operating voltage for the SRAM cells (Vcell) that is slightly higher than the operating voltage of the device's logic components (Vdd). Vcell must be carefully selected, however. If Vcell is too high in comparison to Vdd, the SRAM cells may be too strong, and a write driver may have difficulty writing new data into the cells. If, on the other hand, Vcell is too low in comparison to Vdd, the SRAM cells may be too weak, and the data stored in the cells may be corrupted when the cells are read. There is therefore an optimal range for Vcell in comparison to Vdd, such that the stability and writability described above are avoided.

While it may be a relatively straightforward matter to determine the optimal range for the ratio of Vcell to Vdd, there may be variations in these voltages due to operation of the device (e.g. more or fewer components drawing power.) As each of the two operating voltages changes, the ratio between them changes, potentially resulting in the failure of write operations or the corruption of data during read operations.

It would therefore be desirable to provide systems and methods for preventing data corruption during read or write operations in systems that use different voltages for logic components and SRAM cells.

SUMMARY OF THE INVENTION

One or more of the problems outlined above may be solved by the various embodiments of the invention. Broadly speaking, the invention includes systems and methods for reducing instability and writability problems that arise from relative variations between the voltage at which memory cells operate and the voltage at which logic components that access the memory cells operate by inhibiting memory accesses when the voltages are not within an acceptable operating range.

One embodiment comprises a system having a set of logic components which receive power at a first voltage and a set of memory cells which receive power at a second voltage. The system includes a critical condition detector which is configured to monitor the first and second voltages and to determine whether these voltages are within an acceptable range. When the voltages are not within the acceptable range, the system inhibits accesses to the memory cells.

The logic components may, for example, consist of a pipelined processor, and accesses to the memory cells may be inhibited by stalling the pipeline. The voltages provided to the logic and memory cells may be monitored by a critical condition detector that can be implemented either on the same die as the processor and memory, or off the die. If the critical condition detector is on the die, it can generate an exception upon detecting that the voltages are not in the acceptable range. A privileged software exception handler can then stall the pipeline in response to the exception. If the critical condition detector is implemented off the die, an interrupt can be generated, and the pipeline stalled by an interrupt handler. The critical condition detector may determine whether the voltages are in the acceptable range by determining a ratio or a difference between the voltages and then determining whether this ratio or difference is within an acceptable range. The voltages may be monitored off the die, where they are more stable or vary more slowly than on-die voltage.

Another embodiment comprises a method including providing power to a set of logic components at a first voltage and to a set of memory cells at a second voltage, determining whether the first and second voltages are within an acceptable range, and enabling or inhibiting accesses to the memory cells, depending upon whether or not the first and second voltages are within the acceptable range. If the voltages are within the acceptable range, memory accesses are enabled. If the voltages are not within the acceptable range, memory accesses are inhibited. The method may be implemented in a pipelined processor, with memory accesses being inhibited by stalling the pipeline. Exceptions or interrupts may be generated to cause exception or interrupt handlers to stall the pipeline. The voltages may be monitored by a device on or off the processor die. The voltages are preferably off-die voltages, which vary more slowly than on-die voltages. The on-die voltages may be estimated from the off-die voltages, and in-range determinations made based on the estimations.

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
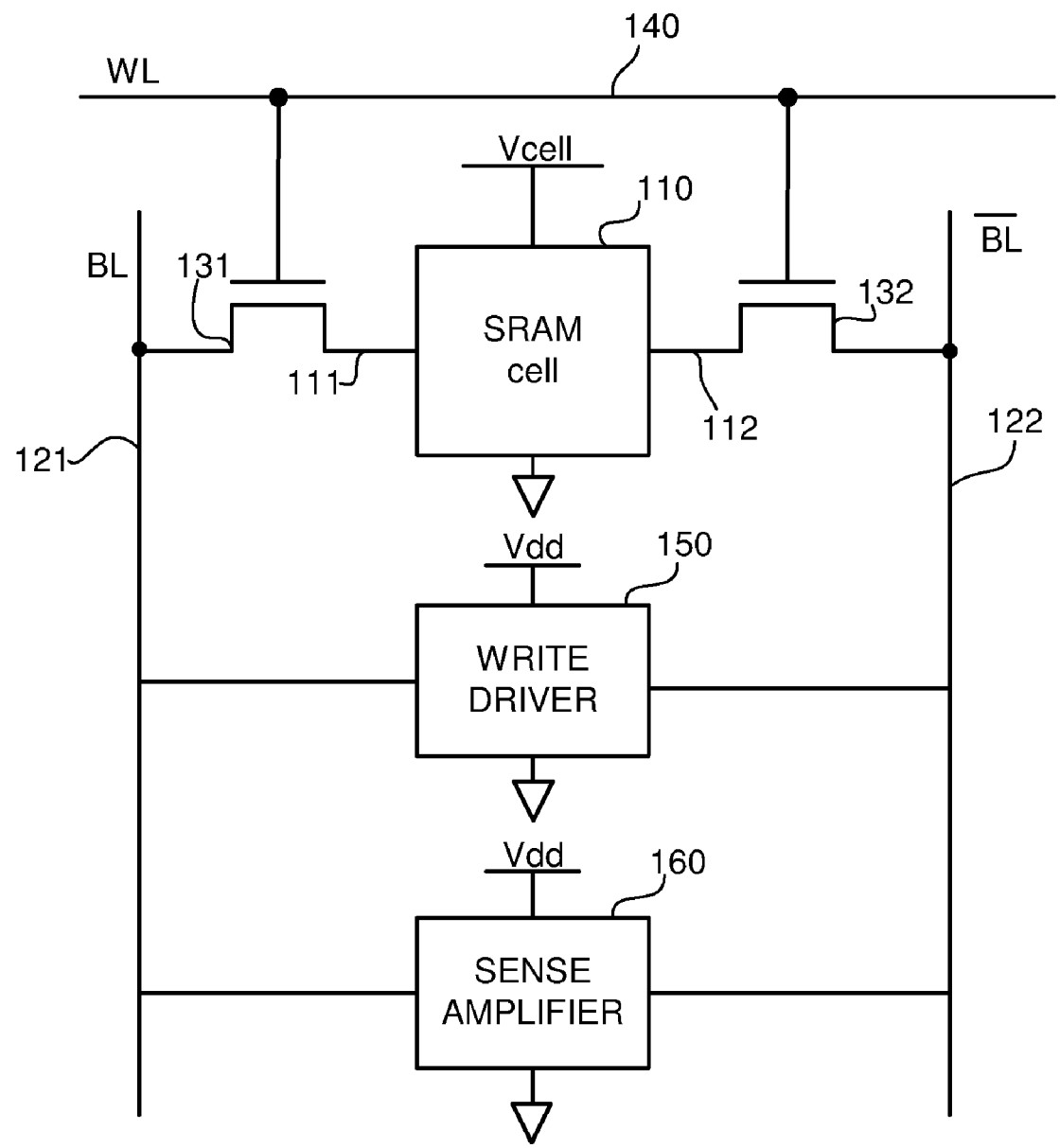
FIG. 1 is a diagram illustrating the interconnection of an SRAM cell and a corresponding write driver in accordance with the prior art.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

Broadly speaking, the invention includes systems and methods for preventing data corruption in systems that use different voltages for logic components and SRAM cells by monitoring the two voltages and inhibiting memory read and write operations when the ratio of the two voltages is not within an acceptable range.

In one exemplary embodiment, a device comprises a computing system that includes a processor and a memory system. The processor, and possibly the memory system, include logic components which operate using a first operating voltage, Vdd. The memory system, which may be integrated with the processor, comprises SRAM memory cells which are continued to operate using a second operating voltage, Vcell.

A critical condition detector is implemented in the computing device to monitor the respective levels of Vdd and Vcell and to compare these levels to determine if the ratio of Vcell to Vdd is within an acceptable range. If the ratio of Vcell to Vdd is within the acceptable range, operation of the computing device proceeds normally. If, however the ratio of Vcell to Vdd falls outside the acceptable range, the computing device inhibits accesses (e.g., read or write operations) to the SRAM cells. In this embodiment, accesses to the SRAM cells are inhibited by stalling the processor so that no instructions involving memory accesses are executed by the processor. When the ratio of Vcell to Vdd returns to the acceptable range, processing of instructions within the pipeline is resumed, allowing memory accesses to proceed.

The critical condition detector may be implemented on the same chip as the processor, or it may be implemented off-chip. If the critical condition detector is implemented on-chip, detection of a Vcell/Vdd ratio that is outside the acceptable range causes generation of an exception that is processed by privileged exception-handling software. If the critical condition detector is implemented off-chip, detection of an out-of-range Vcell/Vdd ratio causes an interrupt to be generated and conveyed to the processor, so that a software interrupt-handler can stall the pipeline. When the Vcell/Vdd ratio returns to the acceptable range, the exception handler or interrupt handler complete the processing of the respective exception or interrupt, and the processor resumes normal processing of instructions.

Before describing the invention in detail, it may be helpful to review the cause of the SRAM stability and writability problems that are intended to be resolved. Referring now to FIG. 1, a diagram illustrating the interconnection of an SRAM cell and a corresponding write driver is shown. SRAM cell 110 is configured to store a data bit at a first node 111 and the inverse of this bit at a second node 112. Node 111 is alternately connected to or disconnected from a bit line 121 by a transistor 131. Similarly, node 112 is alternately connected to or disconnected from a bit line 122 by a transistor 132. Transistors 131 and 132 are switched on or off by a signal on word line 140. Write driver 150 is connected to bit lines 121 and 122, and is configured to drive the bit lines to appropriate voltages during a write operation. Sense amplifier 160 is also connected to bit lines 121 and 122, and is configured to sense differences in the voltages on the respective bit lines and output a corresponding bit value during a read operation.

During a read operation, bit lines 121 and 122 are first pre-charged to a particular voltage which, in this case, is Vdd. The signal on word line 140 is then asserted, switching on transistors 131 and 132. One of nodes 111 and 112 will be high (Vcell) and the other will be low (0), depending upon whether SRAM cell 110 stores a 1 or a 0. Whichever node is high will not substantially affect the voltage on the corresponding one of bit lines 121 and 122. The one of nodes that is low, however, will pull down the voltage on the corresponding one of the bit lines, causing it to be slightly lower than the voltage on the other of the bit lines. Sense amplifier 160 is configured to sense this difference and to output either a 1 or a 0, depending upon which of the bit lines has the lower voltage.

If Vcell is too low with respect to Vdd, SRAM cell 110 may not be strong enough to pull down one of the bit lines, which may prevent the data in the SRAM cell from being properly read. Further, if Vcell is too low with respect to Vdd, the voltage on the bit lines may pull up the voltage of the low one of nodes 111 and 112 enough to cause the voltages on the nodes to flip. The data in SRAM cell 110 would thereby be corrupted. It is therefore important that Vcell not be too low with respect to Vdd, During a write operation, write driver 150 drives one of bit lines 121 and 122 high (to Vdd) and drives the other low (to 0). When the signal on word line 140 is asserted, transistors 131 and 132 are switched on, connecting node 111 to bit line 121 and node 112 to bit line 122. The high one of bit lines 121 and 122 pulls up the voltage of the corresponding node of SRAM cell 110, while the low bit line pulls down the voltage of the other node. When the signal on word line 140 is deasserted, transistors 131 and 132 are switched off, and SRAM cell 110 drives the voltage of the higher-voltage node to Vcell while driving the voltage of the lower-voltage node to 0.

If the data being written to SRAM cell 110 is the opposite of the bit already stored in the cell, the high bit line has to pull up the voltage at the corresponding node of the SRAM cell (and the low bit line has to pull down the voltage at the other node) enough that the relationship of the voltages is inverted. In other words, then node which was previously at 0 now has to be at a higher voltage than the other node. If Vcell is too high with respect to Vdd, however, the bit lines may not be able to pull up (or down) the voltages of the corresponding nodes enough to do this. Put another way, if Vcell is too high, SRAM cell 110 may be too strong to have the new data written into it. It is therefore important that Vcell not be too high with respect to Vdd.

Figure 2:
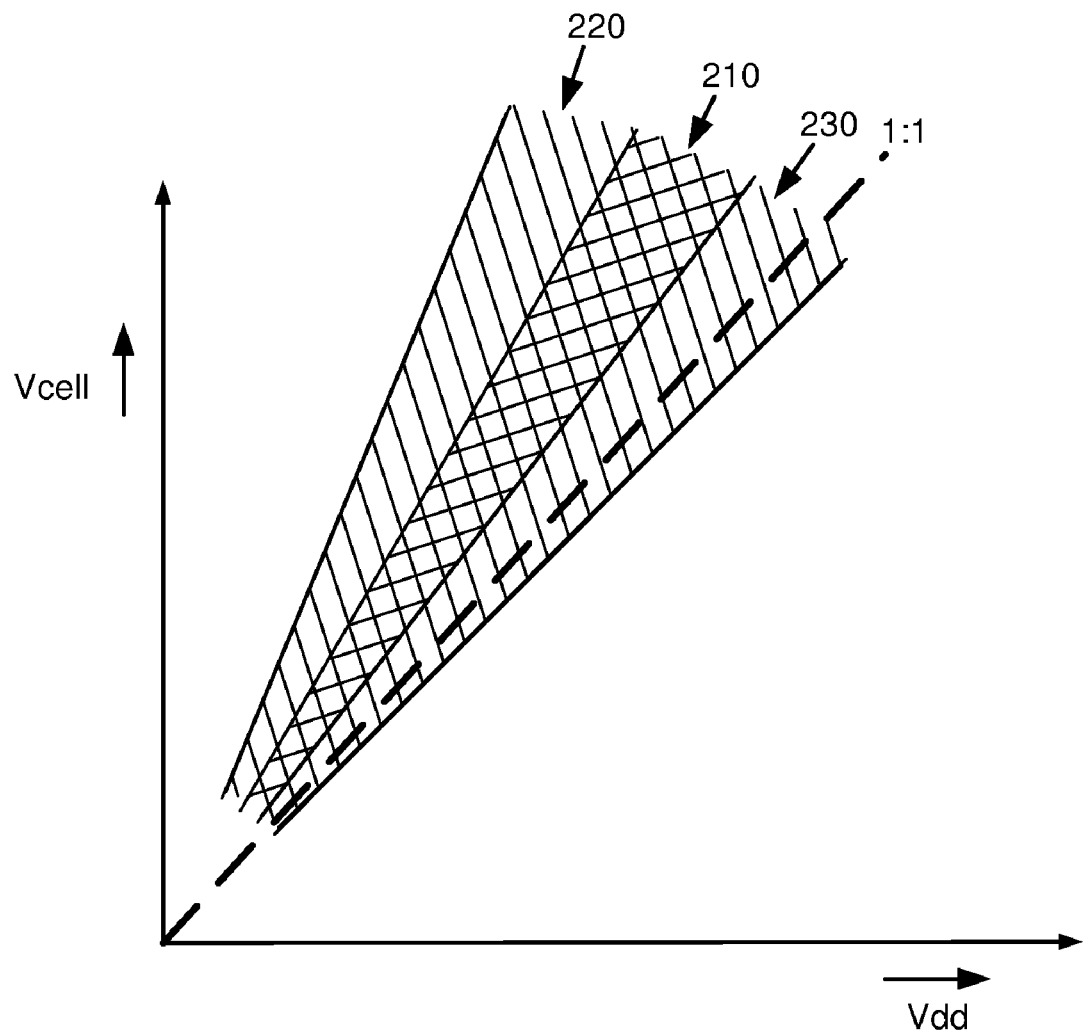
FIG. 2 is a diagram illustrating a desired relationship between the voltage at which memory cells operate (Vcell) and the voltage at which logic components operate (Vdd).

Referring to FIG. 2, a diagram illustrating the desired relationship between Vcell and Vdd is shown. In this figure, Vcell is depicted on the vertical axis, while Vdd is depicted on the horizontal axis. As explained above, it is desirable for the ratio of Vcell to be greater than Vdd, but the ratio of these voltages should not be too high or too low. A desired operating range 210 can therefore be defined (e.g., by choosing an optimal ratio of Vcell to Vdd and setting the limits of the range to +/−10% of this ratio.) It should be noted that the acceptable range of Vcell/Vdd ratios may be wider or narrower, depending upon the particular system and the components used therein. For example, one system might be less tolerant of variations and might therefore need to stay within the range 210, while another system which is more tolerant of variations may be able to operate in the range that also includes 220 and 230.

Figure 3:
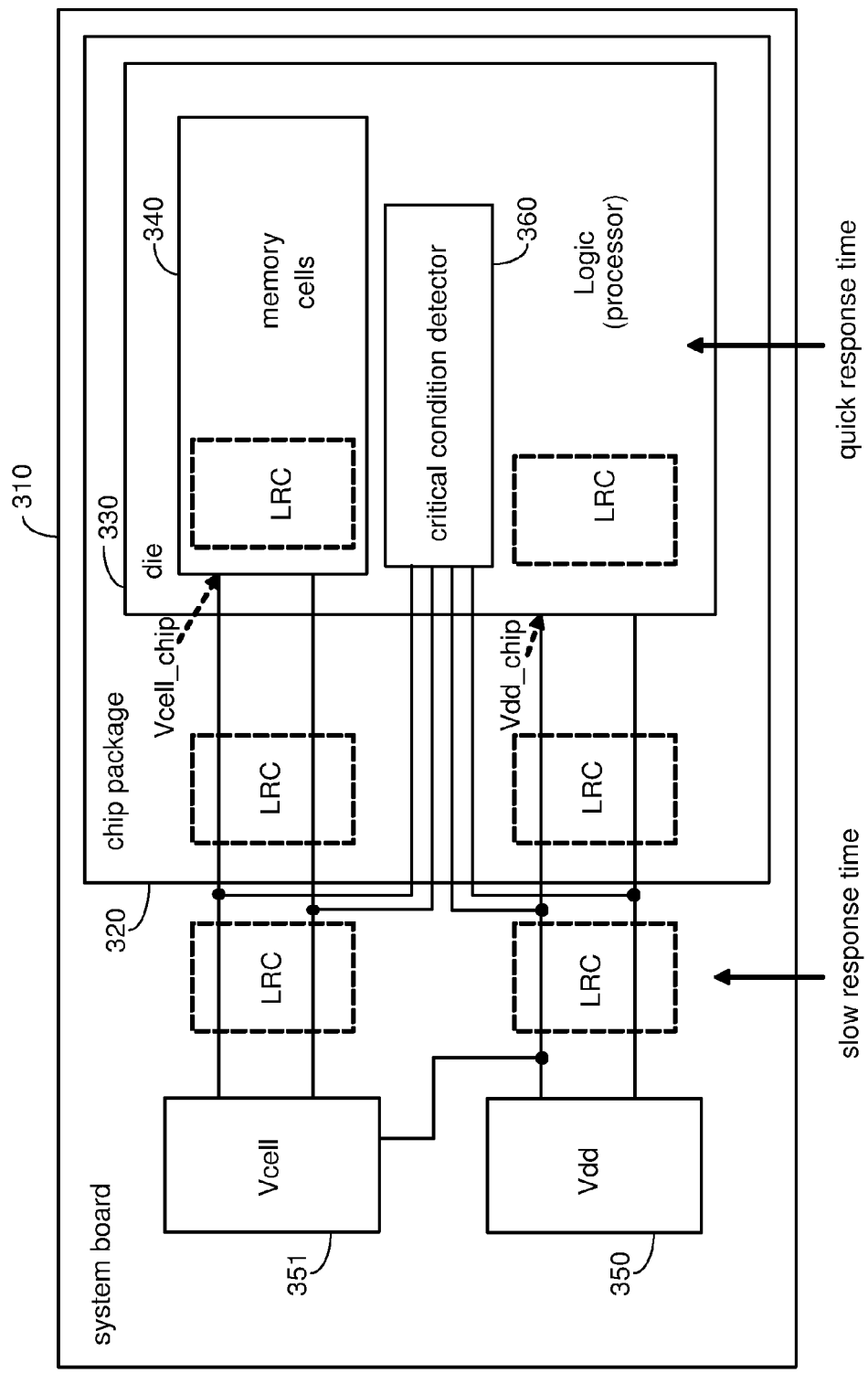
FIG. 3 is a diagram illustrating a computing system in which one embodiment of the invention is implemented.

Referring to FIG. 3, a diagram illustrating a computing system in which one embodiment of the invention is implemented is shown. The computing system includes a system board 310 which has a chip package 320 installed thereon. Within chip package 320 is a die 330 that includes the processor logic, as well as memory cells 340. Various logic components of system board 310, chip package 320 and die 330 are coupled to a voltage regulator that supplies these components with an operating voltage, Vdd. Memory cells 340, and possibly other memory cells within the system, are supplied with an operating voltage, Vcell, by voltage regulator 351.

The computing system of FIG. 3 includes a critical condition detector 360. In this embodiment, critical condition detector 360 is implemented on the same die (330) as the processor logic and SRAM cells 340. Critical condition detector 360 is coupled to the power distribution networks through which Vcell and Vdd are supplied to SRAM cells 340 and the processor logic. More specifically, critical condition detector 360 is connected to the power distribution networks at the board level (outside chip package 320,) for reasons which will be explained below.

FIG. 3 includes several dashed boxes labeled "LRC". These boxes do not represent specific physical components of the system, but instead represent the parasitic inductance (L), resistance (R) and capacitance (C) of the system between the voltage regulators and the memory cells or processor logic. A portion of the parasitic inductance/resistance/capacitance is associated with system board 310, a portion is associated with chip package 320, and a portion is associated with the logic and memory cells 340. The effect of the parasitic inductance/resistance/capacitance at the board, package and chip levels are determined by characteristics of board, package and chip, respectively. Typically, the response time of the voltage level outside chip package 320 is slower than the response time of the voltage within die 330.

Figure 4:
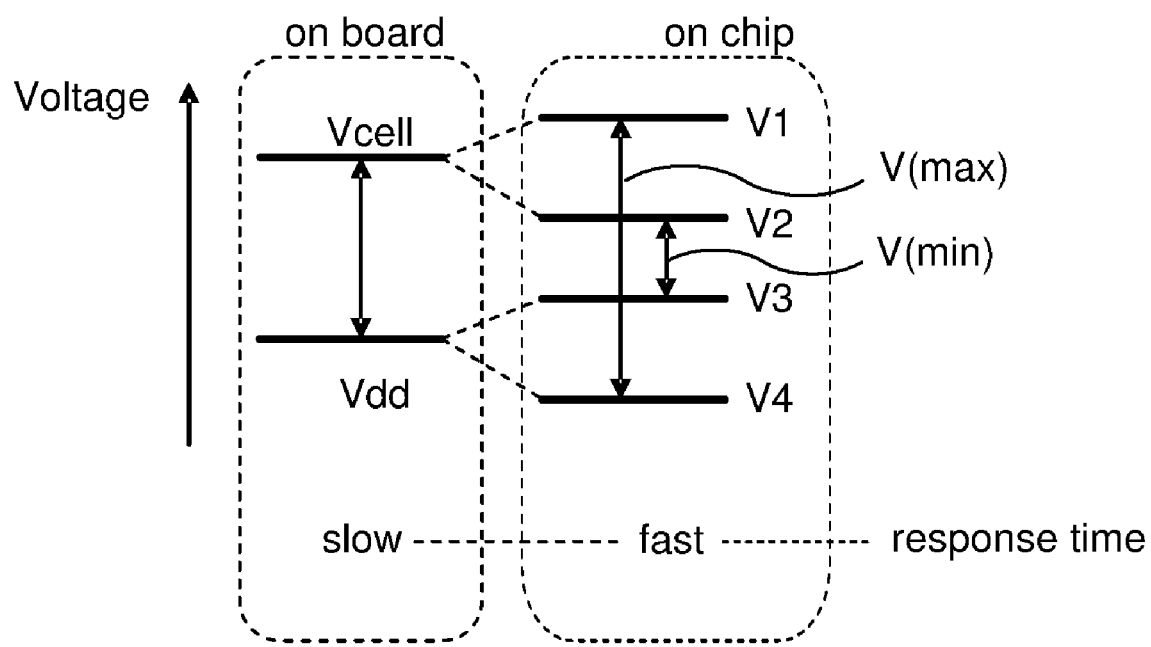
FIG. 4 is a diagram illustrating the relationship of board-level voltages to chip-level voltages in accordance with one embodiment.

Because the voltages measured at the board level vary more slowly than those measured at the chip level, Vcell and Vdd are measured at the board level. The board-level voltages can then be used to estimate Vcell and Vdd at the chip level. Referring to FIG. 4, a diagram illustrating the relationship of the board-level voltages to the chip-level voltages is shown. Considering Vcell, for example, it can be estimated based upon the known structure of the power distribution networks that Vcell on the chip will be between a minimum cell voltage, V2, and a maximum cell voltage, V1. Minimum voltage V2 is determined by subtracting a known voltage from Vcell as measured at the board level, while maximum voltage V1 is determined by adding a known voltage to Vcell as measured at the board level. The same procedure is used to estimate the minimum and maximum possible values of Vdd on the chip. Then, the ratio of Vcell to Vdd can be determined to be between a minimum ratio of V2/V3 and maximum ratio of V1/V4. It is this ratio which is monitored to determine whether it falls within the acceptable range.

Figure 5:
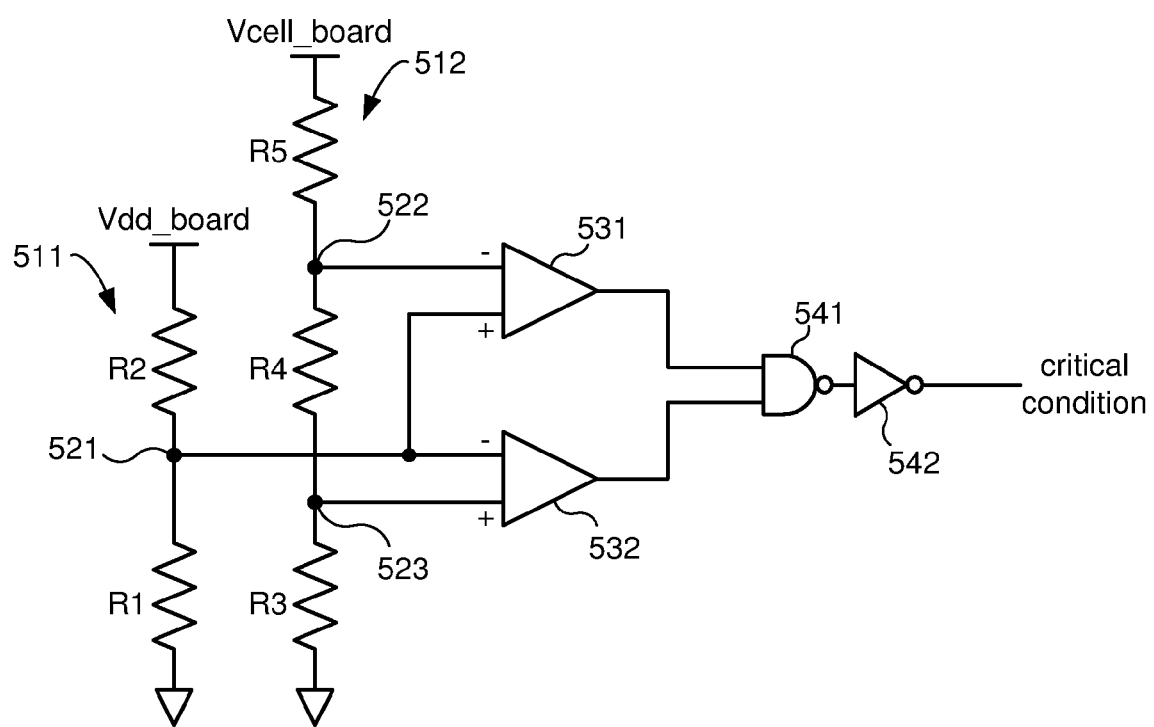
FIG. 5 is a diagram illustrating the structure of a critical condition detector in accordance with one embodiment.

Referring to FIG. 5, a diagram illustrating the structure of a critical condition detector in accordance with one embodiment is shown. In this embodiment, Vdd is applied across a first series of resistors 511, while Vcell is applied across a second series of resistors 512. The voltage at point 521 in the first series of resistors is provided to each of comparators 531 and 532. A second input of comparator 531 is provided by tapping the voltage at point 522 in the second series of resistors. A second input of comparator 532 is provided by tapping the voltage at point 523 in the second series of resistors. The output of each of comparators 531 and 532 is provided as an input to an OR gate (which, in this case, consists of NOR gate 541 in series with inverter 542.) A critical condition signal is provided at the output of inverter 542.

The critical condition detector of FIG. 5 operates by comparing predetermined percentages of Vcell and Vdd. It can be seen that: the voltage at 521 is R1/(R1+R2); the voltage at 522 is (R3+R4)/(R3+R4+R5); and the voltage at 523 is R3/(R3+R4+R5). The specific values of the resistors can be chosen so that the voltages at 521, 522 and 523 have the desired ratios.

For example, it may be desired to maintain a ratio of Vcell to Vdd which is 1.2±10%. One comparator should therefore be configured to determine when Vcell>1.32 Vdd, and the other comparator should be configured to determine when Vcell<1.08 Vdd. Thus, R3/(R3+R4+R5)=1.32*R1/(R1+R2), and (R3+R4)/(R3+R4+R5)=1.08*R1/(R1+R2). Then, if Vcell/Vdd<1.08, the output of comparator 531 will be asserted, resulting in assertion of the critical condition signal at the output of inverter 542. If Vcell/Vdd is between 1.08 and 1.32, neither the output of comparator 531 nor the output of comparator 532 will be asserted, so the critical condition signal at the output of inverter 542 will not be asserted. Finally, if Vcell/Vdd>1.32, the output of comparator 532 will be asserted, so the critical condition signal at the output of inverter 542 will be asserted.

Figure 6:
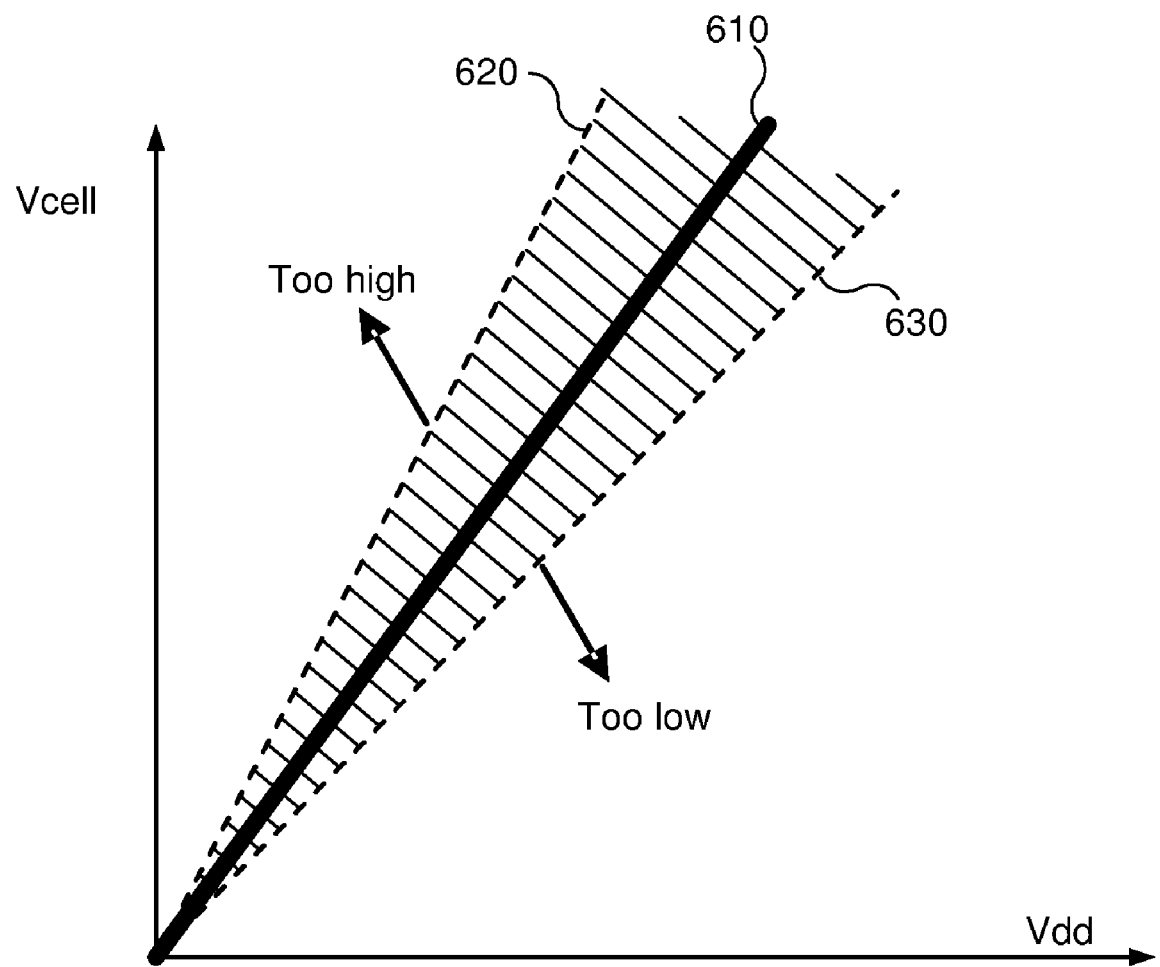
FIG. 6 is a diagram illustrating a desired ratio of Vcell to Vdd and the limits above and below which a critical condition signal will be asserted in accordance with one embodiment.

The operation of the critical condition detector is illustrated in FIG. 6. This figure is a diagram illustrating the desired ratio of Vcell to Vdd, as well as the limits above and below which the critical condition signal will be asserted. As in the example above, the desired ratio of Vcell to Vdd is 1.2. This ratio is indicated by line 610. The maximum acceptable ratio of Vcell to Vdd is 1.32, indicated by line 620. The minimum acceptable ratio of Vcell to Vdd is 1.08, indicated by line 630. Thus, if the ratio of Vcell to Vdd falls in the shaded area between lines 620 and 630, the critical condition signal will not be asserted, but if the ratio is above line 620 or below line 630, the critical condition signal will be asserted.

As noted above, the desired ratio of Vcell to Vdd, as well as the acceptable range for the ratio, may be different in alternative embodiments. Similarly, the components of the critical condition detector, including the resistor values, as well as the comparators and logic components, may vary in other embodiments. It should also be noted that, while the foregoing examples are intended to determine whether a critical condition exists based on the ratio of Vcell to Vdd, alternative embodiments may be configured to determine whether a critical condition exists based on a voltage difference between Vcell and Vdd, rather than a ratio. The decision to use a ratio or voltage difference may be based on a variety of factors, such as component or circuit characteristics, manufacturing process conditions, and the like.

Figure 7:
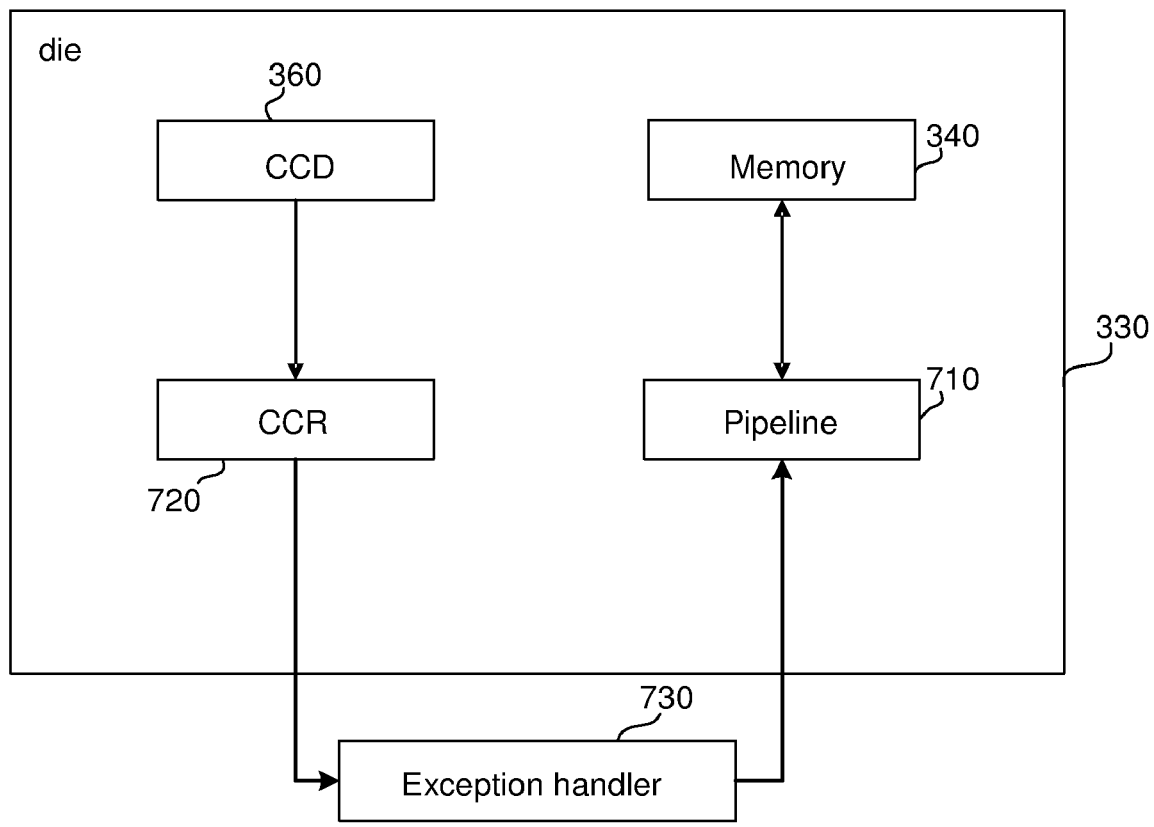
FIG. 7 is a functional block diagram illustrating the structure of a processor that implements a critical condition detector in accordance with one embodiment.

Referring to FIG. 7, a functional block diagram illustrating the structure of a processor that implements a critical condition detector in accordance with one embodiment is shown. FIG. 7 depicts four of the components that are implemented on processor die 330. These components include a pipeline 710 of the processor, SRAM memory cells 340, critical condition detector 360 and critical condition register 720. In this embodiment, critical condition detector 360 may, for example, be of the type described in connection with FIG. 5. Critical condition detector 360 is configured to monitor Vcell and Vdd, and to determine, as described above, whether a critical condition exists. When critical condition detector 360 detects that the ratio of Vcell to Vdd (or the difference between Vcell and Vdd) is either too high or too low, a signal is asserted indicating this condition. The signal is provided to critical condition register 720, setting a critical condition indicator bit in the register. In alternative embodiments, the critical condition indicator can include multiple bits instead of a single bit. For example, critical condition detectors can be implemented to detect multiple voltage levels, and the data from all of these critical condition detectors may be stored in critical condition register 720. The exception handler can then handle exceptions according to the multiple bits in the critical condition register.

The critical condition bit in critical condition register 720 is monitored by a software exception handler 730 which is being executed by the processor. When exception handler 730 determines that a critical condition exists (based upon the state of the critical condition bit in critical condition register 720,) the exception handler stalls pipeline 710. Because pipeline 710 is stalled, it cannot complete execution of any memory operations, thereby preventing read or write operations to SRAM cells 340 which could be subject to the stability and/or writability problems described above. When the ratio of (or difference between) Vcell and Vdd return to an acceptable range, the signal output by critical condition detector 360 is deasserted, thereby resetting the critical condition bit in critical condition register 720. When exception handler 730 sees that the critical condition bit has been reset, pipeline 710 is allowed to resume process of instructions, including any instructions that result in accesses to SRAM cells 340.

Figure 8:
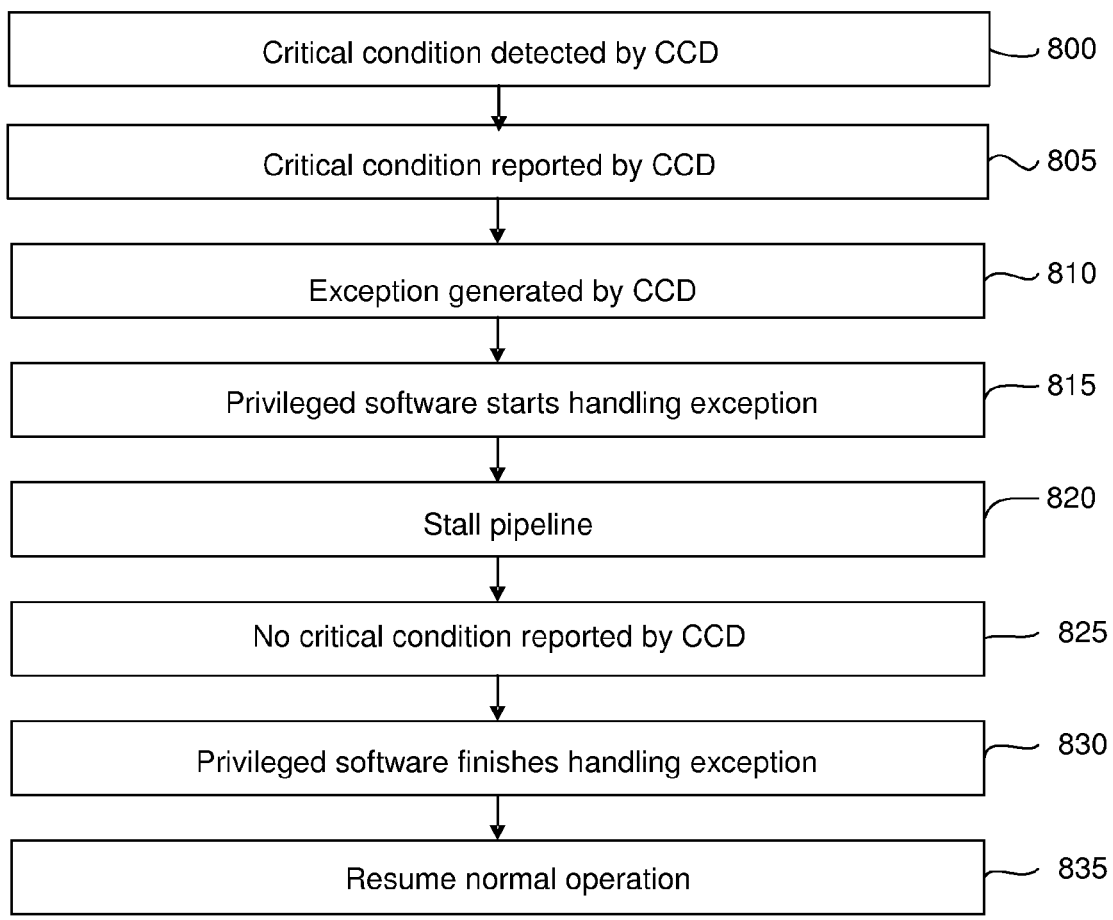
FIG. 8 is a flow diagram summarizing a method of operation of a processor system in accordance with FIG. 7.

Referring to FIG. 8, a flow diagram summarizing a method of operation of a processor system in accordance with FIG. 7 is shown. This method begins with detection of a critical condition by the critical condition detector (800.) After the critical condition is detected, it is reported by the critical condition detector (805,) e.g., by setting a critical condition indicator bit in a critical condition register. The reporting of the critical condition results in the generation of an exception (810,) which is handled by privileged exception handling software (815.) The exception handling software stalls the pipeline of the processor (820.) The pipeline remains stalled until the critical condition detector reports that there is no longer a critical condition (825.) When the critical condition ends, the exception handler software completes the handling of the exception (830) and allows the pipeline to resume normal operation (835.)

Figure 9:
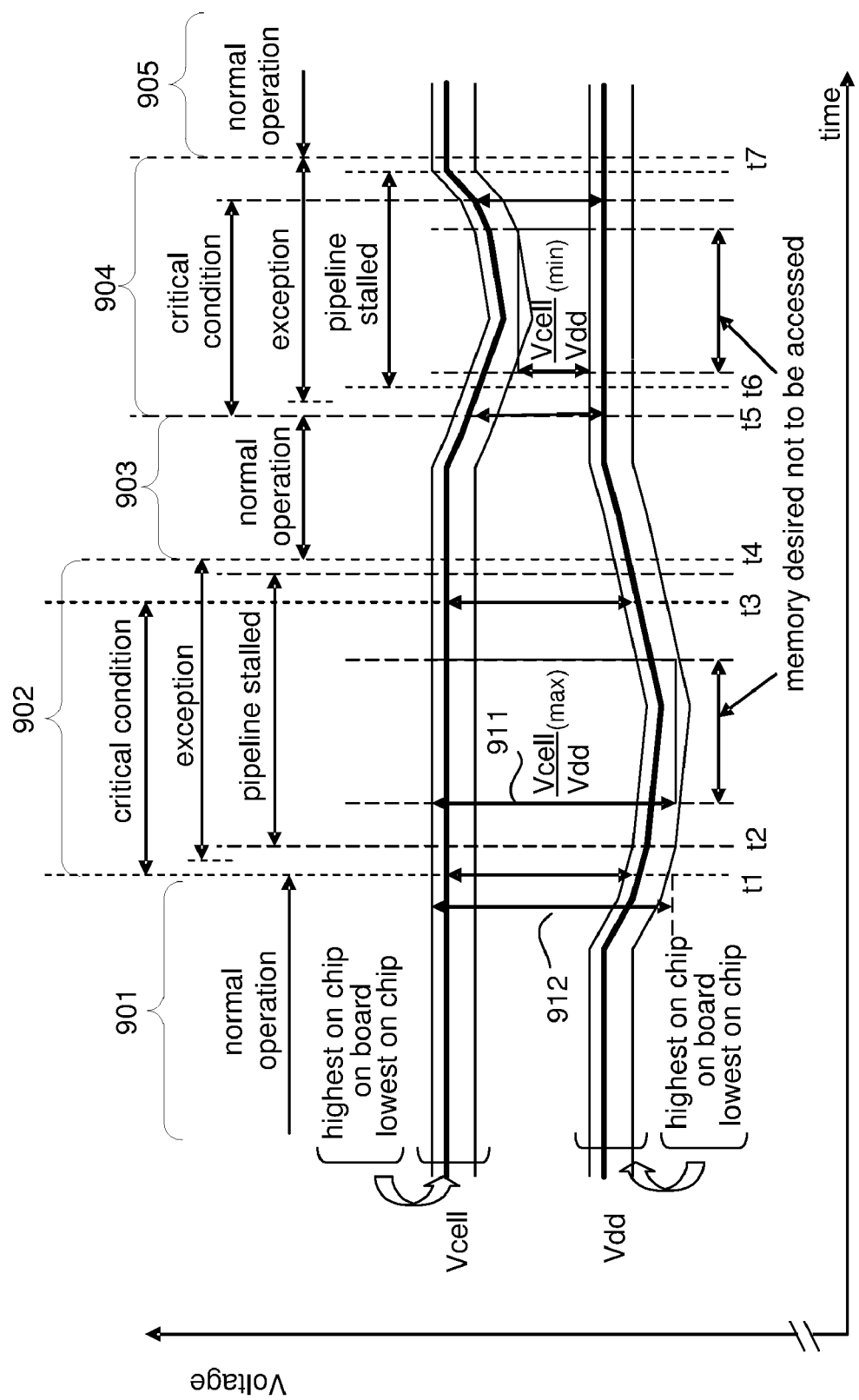
FIG. 9 is a diagram illustrating exemplary scenarios in which system in accordance with one embodiment detects critical conditions and temporarily prevents memory accesses.

Referring to FIG. 9, a diagram illustrating exemplary scenarios in which the present system detects critical conditions and temporarily prevents memory accesses is shown. In this figure, voltages are plotted as a function of time. There are six lines running from left to right across the figure. The upper three lines correspond to Vcell, while the lower three lines correspond to Vdd. The bold center line corresponding to Vcell represents the value of Vcell as measured at the board level. The highest of the three lines corresponding to Vcell represents the estimated maximum value of Vcell on the die, while the lowest of the three lines represents the estimated minimum value of Vcell on the die. Similarly, the bold center line corresponding to Vdd represents the measured board-level value of Vdd, while the highest of the lines corresponding to Vdd represents the estimated maximum value of Vdd on the die, and the lowest of the lines represents the estimated minimum value of Vdd on the die. The minimum and maximum estimated values of Vcell and Vdd are computed based on the measured board-level values of Vcell and Vdd, respectively.

FIG. 9 is broken into a series of five intervals, 901-905. Intervals 901, 903 and 905 illustrate "normal" operation of the system, while intervals 902 and 904 illustrate operation during the existence of critical conditions. During operation, the ratio of Vcell to Vdd is monitored and, if the ratio is within an acceptable range the system is considered to be operating normally. As shown in intervals 901, 903 and 905, the ratio of Vcell to Vdd may vary but, as long as the ratio stays within the acceptable range, the processor will be allowed to continue normal operation (e.g., the pipeline will not be stalled.)

It can be seen that, at the end of interval 901, Vdd begins to drop, causing an increase in the ratio of Vcell to Vdd. At the beginning of interval 902 (at time t1) the ratio exceeds the upper threshold of the acceptable range, so the critical condition detector asserts the critical condition indicator signal. Assertion of this signal causes an exception to be generated, which in turn results in the pipeline being stalled at time t2. Vdd continues to drop and then begins to increase. At time t3, Vdd has increased to the point that the ratio of Vcell to Vdd is again within the acceptable range of values. Upon detecting this, the critical condition detector deasserts the critical condition indicator signal, causing the exception handler to resume the stalled pipeline and complete the handling of the exception. At time t4, normal operation of the system has resumed.

It should be noted that FIG. 9 depicts a maximum allowable difference between Vcell and Vdd (911.) (As noted above, a given embodiment may determine critical conditions based upon ratios of Vcell to Vdd or differences between Vcell and Vdd—voltage difference 911 may therefore be interpreted as either a ratio or a voltage difference, depending upon the particular embodiment.) It can be seen that the critical condition detector, which estimates the maximum voltage difference based on the relatively slowly varying board-level voltage measurements, detects a critical condition before the die-level voltage difference reaches a level that requires stalling of the pipeline. Conversely, the critical condition detector continues to indicate that a critical condition exists Intel after the die-level voltage difference returns to an acceptable level. These characteristics allow the system to generate an exception and stall the pipeline before stability and/or writability problems arise.

Referring to interval 903 of FIG. 9, it can be seen that Vcell begins to drop near the end of the interval. At time t5, the critical condition detector determines that the estimated minimum voltage difference between Vcell and Vdd has fallen below the lower threshold of the acceptable range and consequently asserts the critical condition indicator signal. An exception is therefore generated, causing the exception handler to stall the pipeline are at time t6. When Vcell rises enough that the voltage difference between Vcell and Vdd is again within the acceptable range, the critical condition detector deasserts the critical condition indicator signal, causing the exception handler to resume the stalled pipeline and then complete handling of the exception. At time t7, the system has again resumed normal operation.

It can be seen that the operation of the system during the existence of a critical condition in interval 904 is similar to the operation during interval 902, in that the estimation of the minimum voltage difference between Vcell and Vdd determined based upon board-level voltages results in the early detection of the critical condition and maintains the indication of the critical condition until after it is safe to resume memory accesses.

Figure 10:
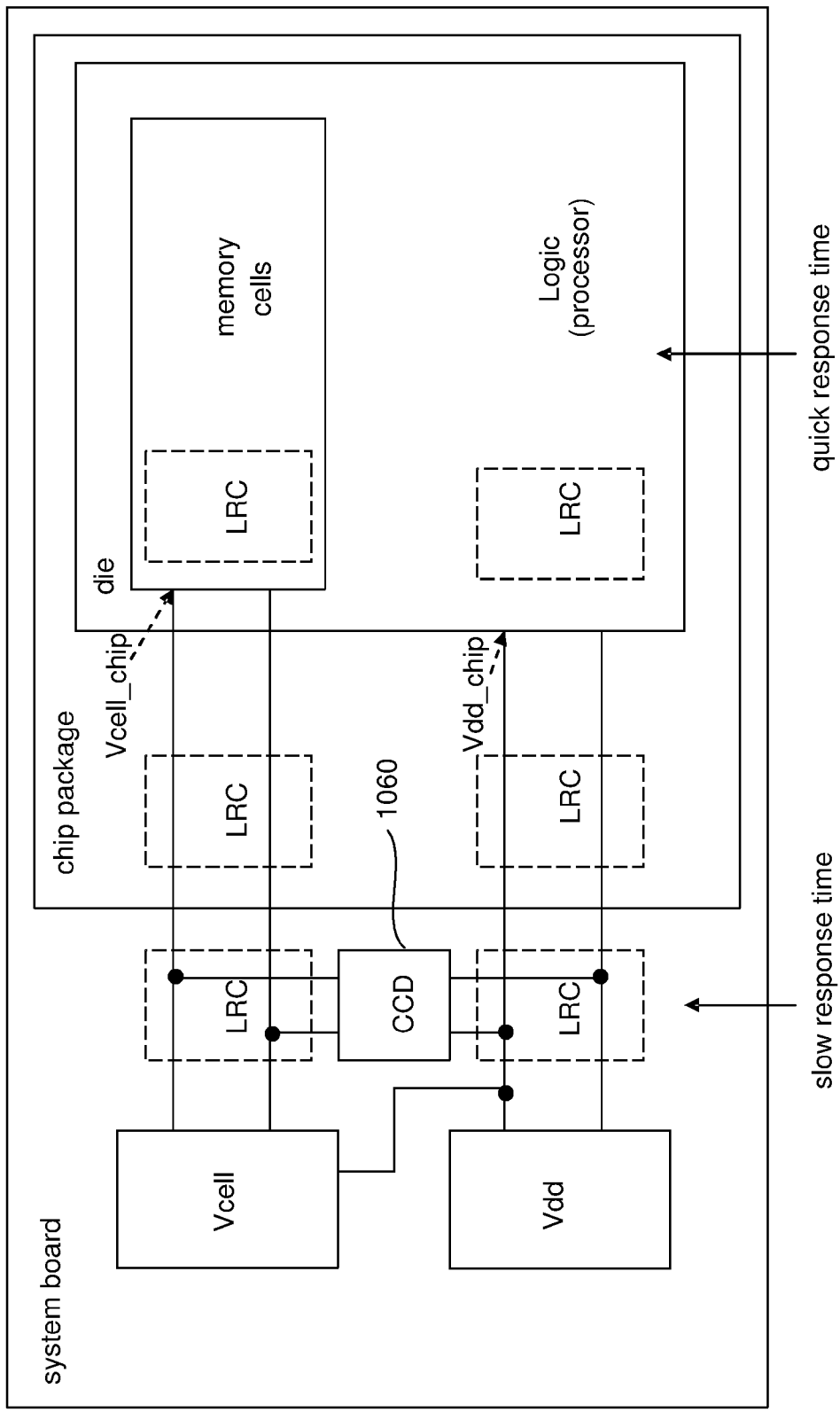
FIG. 10 is a functional block diagram illustrating the structure of an alternative embodiment that employs an off-chip critical condition detector.
Figure 11:
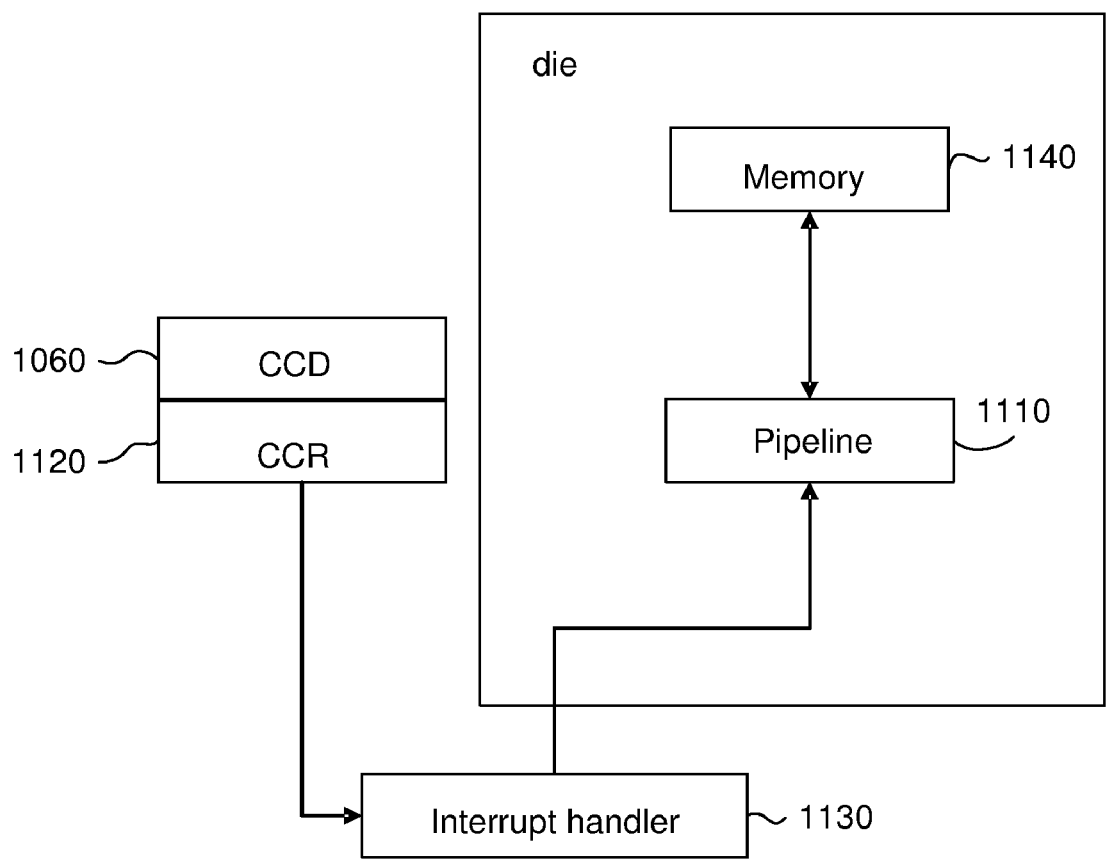
FIG. 11 is a functional block diagram illustrating the relationship of a critical condition detector, interrupt handler and pipeline in the alternative embodiment of FIG. 10.
Figure 12:
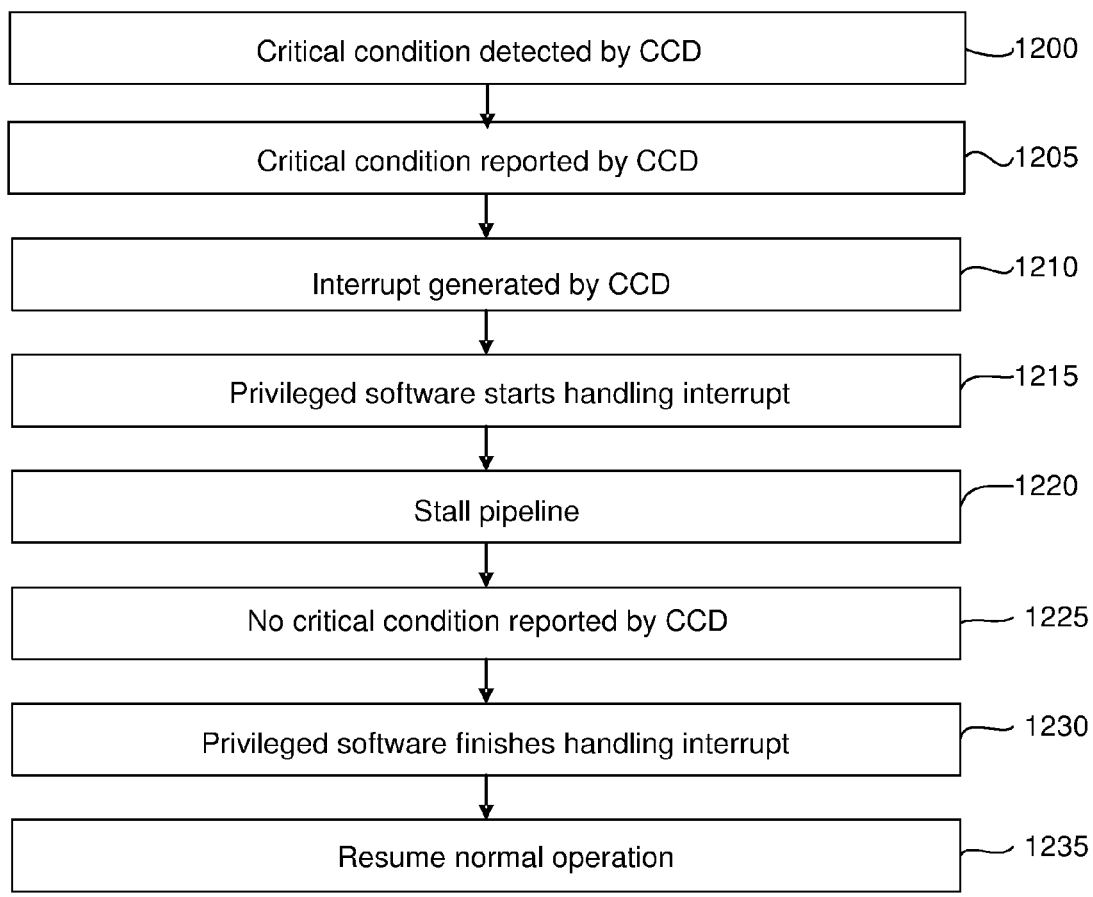
FIG. 12 is a flow diagram illustrating a method employed by the alternative embodiment of FIG. 10.

The embodiments described above involve implementation of the critical condition detector on the processor die and generation of exceptions to effect stalling of the pipeline. In an alternative embodiment, the critical condition detector is implemented off the processor die. This embodiment is illustrated in FIGS. 10-12. FIG. 10 is a functional block diagram illustrating the structure of an alternative embodiment that employs an off-chip critical condition detector. FIG. 11 is a functional block diagram illustrating the relationship of the critical condition detector, interrupt handler and pipeline in this alternative embodiment. FIG. 12 is a flow diagram illustrating a method employed by this alternative embodiment.

Referring to FIG. 10, the structure of the system is, for the most part, identical to the embodiments described above. The difference between this system and the system illustrated in FIG. 3 is that critical condition detector 1060 is implemented at the board level, rather than the die level. It should be noted that the critical condition detector continues to monitor the values of Vcell and Vdd at the board level instead of the die level.

Referring to FIG. 11, the purpose of the critical condition detector remains the same as in the previous embodiment, but the implementation is slightly different because the critical condition detector is implemented on the board instead of the processor die. In this embodiment, critical condition detector 1060 monitors the board-level values of Vcell and Vdd and, if the ratio (or difference) of these values is not within an acceptable range, a critical condition indicator signal is asserted and a bit in critical condition register 1120 is set to indicate that critical condition. Because critical condition register 1120 is also implemented at the board level, an interrupt handler 1130 is used to monitor the register instead of an exception handler. When interrupt handler 1130 determines that the bit in critical condition register 1120 has been set, the interrupt handler stalls pipeline 1110 in much the same way the processor was stalled by the exception handler in the previous embodiments because pipeline 1110 is stalled during critical conditions, SRAM cells 1140 cannot be accessed during this time, and stability/writability problems resulting from sub-optimal ratios/differences of Vcell and Vdd are avoided.

Referring to FIG. 12, the operation of this alternative embodiment is very similar to the operation of the previously described embodiments, except that exceptions and exception handlers are replaced by interrupts and interrupt handlers. At 1200, a critical condition is detected by the critical condition detector. The critical condition detector then reports this condition (1205,) causing an interrupt to be generated (1210.) The interrupt is processed by privileged interrupt handling software (1215) which stalls the pipeline (1220.) When there is no longer a critical condition reported by the critical condition detector (1225,) the interrupt handler resumes the pipeline and completes processing of the interrupt (1230.) The system then resumes normal operation (1235.)

The systems and methods described above are intended to be illustrative of the many embodiments of the invention, rather than limiting. For example, as noted above, some embodiments may identify critical conditions based on changes in the ratio of Vcell to Vdd, while others may identify critical conditions based on changes in the difference between Vcell and Vdd. Alternative embodiments may differ from these systems and methods in still other ways, such as monitoring Vcell and Vdd at the chip level rather than the board level, inhibiting memory accesses in ways other than stalling the pipeline, inhibiting memory accesses in devices other than processors, and so on.

Those of skill in the art will understand that information and signals may be represented using any of a variety of different technologies and techniques. For example, data, instructions, commands, information, signals, bits, symbols, and the like that may be referenced throughout the above description may be represented by voltages, currents, electromagnetic waves, magnetic fields, optical fields or particles, and the like. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software (including firmware,) or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein. A processor may also be implemented as a combination of computing devices, e.g., a combination of a DSP and a microprocessor, a plurality of microprocessors, one or more microprocessors in conjunction with a DSP core, or any other such configuration.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A system comprising:
   one or more logic components configured to receive power at a first voltage;
   one or more memory cells configured to receive power at a second voltage; and
   a critical condition detector configured to monitor the first and second voltages and to determine whether the first and second voltages are within an acceptable range;
   wherein the system is configured to inhibit accesses to the memory cells when the critical condition detector determines that the first and second voltages are not within the acceptable range,
   wherein the logic components comprise a processor and the memory cells comprise SRAM cells implemented on an integrated circuit die with the processor; and
   wherein the system is configured to inhibit accesses to the SRAM cells by stalling an instruction processing pipeline in the processor.

2. The system of claim 1, wherein the critical condition detector is implemented on an integrated circuit die with the logic components and the memory cells.

3. The system of claim 2, wherein the critical condition detector is configured to generate an exception when the first and second voltages are not within the acceptable range and wherein a software exception handler is configured to stall the pipeline until the first and second voltages are within the acceptable range.

4. The system of claim 1, wherein the critical condition detector is implemented external to an integrated circuit die on which the logic components and the memory cells are implemented.

5. The system of claim 4, wherein the critical condition detector is configured to generate an interrupt when the first and second voltages are not within the acceptable range and wherein a software interrupt handler is configured to stall the pipeline until the first and second voltages are within the acceptable range.

6. The system of claim 1, wherein the critical condition detector is configured to determine whether the first and second voltages are within the acceptable range by determining whether a ratio of the second voltage to the first voltage is above a minimum threshold and below a maximum threshold.

7. The system of claim 1, wherein the critical condition detector is configured to determine whether the first and second voltages are within the acceptable range by determining whether a difference between the second voltage and the first voltage is above a minimum threshold and below a maximum threshold.

8. The system of claim 1, wherein the critical condition detector is configured to:
   monitor values of the first and second voltages external to an integrated circuit die on which the logic components and the memory cells are implemented;
   estimate minimum and maximum possible values of the first and second voltages on the integrated circuit die; and
   determine whether the first and second voltages are within the acceptable range based upon the estimated minimum and maximum possible values of the first and second voltages on the integrated circuit die.

9. The system of claim 1, wherein the critical condition detector comprises:
   a first comparator configured to assert a first output signal if a first predetermined percentage of the first voltage is greater a first predetermined percentage of the second voltage;
   a first comparator configured to assert a first output signal if a second predetermined percentage of the first voltage is less than a second predetermined percentage of the second voltage; and
   logic configured to assert a critical condition indicator signal if either the first output signal or second output signal is asserted.

10. The system of claim 9, further comprising a critical condition register configured to receive the critical condition indicator signal and to store at least one bit indicative of whether the critical condition indicator signal indicates that a critical condition exists.

11. A method comprising:
    providing power to one or more logic components at a first voltage;
    providing power to one or more memory cells at a second voltage;
    determining whether the first and second voltages are within an acceptable range;
    enabling accesses to the memory cells when the first and second voltages are within the acceptable range; and
    inhibiting accesses to the memory cells when the first and second voltages are not within the acceptable range,
    wherein the logic components comprise a processor and the memory cells comprise SRAM cells implemented on an integrated circuit die with the processor; and
    wherein inhibiting accesses to the memory cells comprises stalling an instruction processing pipeline in the processor.

12. The method of claim 11, further comprising, when the first and second voltages are determined not to be within the acceptable range, using a critical condition detector on the integrated circuit die to generate an exception and thereby causing a software exception handler to stall the pipeline.

13. The method of claim 12, further comprising, when the first and second voltages are determined to be within the acceptable range, removing the exception and thereby causing the exception handler to resume the pipeline.

14. The method of claim 11, further comprising, when the first and second voltages are determined not to be within the acceptable range, using a critical condition detector external to the integrated circuit die to generate an interrupt and thereby causing a software interrupt handler to stall the pipeline.

15. The method of claim 14, further comprising, when the first and second voltages are determined to be within the acceptable range, terminating the interrupt and thereby causing the interrupt handler to resume the pipeline.

16. The method of claim 11, wherein determining whether the first and second voltages are within an acceptable range comprises determining whether a ratio of the second voltage to the first voltage is above a minimum threshold and below a maximum threshold.

17. The method of claim 11, wherein determining whether the first and second voltages are within an acceptable range comprises determining whether a difference between the second voltage and the first voltage is above a minimum threshold and below a maximum threshold.

18. The method of claim 11, wherein determining whether the first and second voltages are within an acceptable range comprises:

monitoring values of the first and second voltages external to an integrated circuit die on which the logic components and the memory cells are implemented;

estimating minimum and maximum possible values of the first and second voltages on the integrated circuit die; and determining whether the first and second voltages are within the acceptable range based upon the estimated minimum and maximum possible values of the first and second voltages on the integrated circuit die.

* * * * *